United States Patent
Onushkin et al.

(10) Patent No.: US 7,884,377 B2
(45) Date of Patent: Feb. 8, 2011

(54) LIGHT EMITTING DEVICE, METHOD OF MANUFACTURING THE SAME AND MONOLITHIC LIGHT EMITTING DIODE ARRAY

(75) Inventors: Grigory Onushkin, Gyunggi-do (KR); Jin Hyun Lee, Gyunggi-do (KR); Myong Soo Cho, Gyunggi-do (KR); Pun Jae Choi, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

(21) Appl. No.: 12/725,970

(22) Filed: Mar. 17, 2010

(65) Prior Publication Data
US 2010/0187548 A1  Jul. 29, 2010

Related U.S. Application Data

(62) Division of application No. 12/071,544, filed on Feb. 22, 2008, now Pat. No. 7,704,771.

(30) Foreign Application Priority Data

Mar. 21, 2007  (KR)  ...................... 10-2007-0027561

(51) Int. Cl.
*H01L 27/15* (2006.01)
*H01L 31/12* (2006.01)
*H01L 33/00* (2006.01)

(52) U.S. Cl. .............................. 257/81; 257/88; 257/93; 257/E21.415; 257/E29.286; 257/E33.066

(58) Field of Classification Search ............... 257/81, 257/88, 93, E21.415, E29.286, E33.066
See application file for complete search history.

(56) References Cited

U.S. PATENT DOCUMENTS

| 5,543,958 | A | 8/1996 | Lebby et al. |
| 2002/0076847 | A1* | 6/2002 | Yamada et al. ................ 438/34 |
| 2004/0075399 | A1 | 4/2004 | Hall |
| 2004/0206970 | A1 | 10/2004 | Martin |
| 2009/0042387 | A1 | 2/2009 | Yamada et al. |
| 2010/0032697 | A1* | 2/2010 | Nagai .......................... 257/98 |

FOREIGN PATENT DOCUMENTS

| JP | 2004-006582 | 1/2004 |
| KR | 10-2006-0020089 A | 3/2006 |
| KR | 10-2006-0097881 A | 9/2006 |
| KR | 10-2005-0121454 A | 11/2006 |

* cited by examiner

Primary Examiner—David S Blum
(74) Attorney, Agent, or Firm—McDermott Will & Emery LLP

(57) ABSTRACT

A light emitting device including: at least one light emitting stack including first and second conductivity type semiconductor layers and an active layer disposed there between, the light emitting stack having first and second surfaces and side surfaces interposed between the first and second surfaces; first and second contacts formed on the first and second surface of the light emitting stack, respectively; a first insulating layer formed on the second surface and the side surfaces of the light emitting stack; a conductive layer connected to the second contact and extended along one of the side surfaces of the light emitting stack to have an extension portion adjacent to the first surface; and a substrate structure formed to surround the side surfaces and the second surface of the light emitting stack.

17 Claims, 7 Drawing Sheets

LIGHT EMITTING DEVICE, METHOD OF MANUFACTURING THE SAME AND MONOLITHIC LIGHT EMITTING DIODE ARRAY

CROSS-REFERENCE TO RELATED APPLICATIONS

This application is a Divisional of U.S. patent application Ser. No. 12/071,544, filed on Feb. 22, 2008, now U.S. Pat. No. 7,704,771 which claims the priority of Korean Patent Application No. 2007-27561 filed on Mar. 21, 2007, in the Korean Intellectual Property Office, the entire contents of each of which are hereby incorporated by reference.

BACKGROUND OF THE INVENTION

1. Field of the Invention

The present invention relates to a light emitting device and a manufacturing method thereof, and more particularly, to a monolithic light emitting diode array in which a circuit structure is easily formed to suit a variety of array configurations of a light emitting diode.

2. Description of the Related Art

In general, a semiconductor light emitting diode is beneficially applicable as a light source in terms of output, efficiency or reliability. Thus, the semiconductor light emitting diode is vigorously researched and developed as a high-output and high-efficiency light source capable of replacing a backlight of a lightening device or a display device.

In general, a light emitting diode is driven at a low direct current. Therefore, in order to drive the light emitting diode at a normal voltage (direct current of 220V), an additional circuit, e.g., alternating current/direct current (AC/DC) converter is required to supply a low DC output voltage.

However, this additional circuit not only complicates configuration of the LED module but also potentially undermines efficiency and reliability. Also, such a complicated structure may cause errors in a process of mounting and assembling individual LEDs. In this case, the LED device may be ruined due to high inverse bias voltage.

To overcome this problem, there has been proposed an LED array which has circuits connected to be driven in response to an alternating current voltage. However, these circuit connections are also complicated, thus posing difficulty to sufficient miniaturization of the LED array.

SUMMARY OF THE INVENTION

An aspect of the present invention provides a light emitting device in which a variety of circuit connection structures, particularly, complicated circuit connection structures can be easily formed to be operable in response to an alternating current (AC) voltage, and a monolithic light emitting diode array.

An aspect of the present invention provides a method of manufacturing a light emitting device having a variety of circuit connection structures, particularly complicated circuit connection structures to be operable in response to the AC voltage, and a monolithic light emitting diode array.

According to an aspect of the present invention, there is provided a A light emitting device including: at least one light emitting stack including first and second conductivity type semiconductor layers and an active layer disposed therebetween, the light emitting stack having first and second surfaces defined by the first and second conductivity type semiconductor layers, respectively to oppose each other and side surfaces interposed between the first and second surfaces; a first contact formed on the first surface of the light emitting stack to contact the first conductivity type semiconductor layer; a second contact formed on the second surface of the light emitting stack to contact the second conductivity type semiconductor layer; a first insulating layer formed on the second surface excluding a portion where the second contact is formed and the side surfaces of the light emitting stack; a conductive layer connected to the second contact and extended along one of the side surfaces of the light emitting stack to have an extension portion adjacent to the first surface; and a substrate structure formed to surround the side surfaces and the second surface of the light emitting stack.

The substrate structure may be formed of a conductive material, the substrate structure further including a second insulating layer disposed between the light emitting stack and the substrate structure to electrically insulate the second contact and the conductive layer of the light emitting stack from the substrate structure. The substrate structure may be a metal layer formed by plating.

Alternatively, the substrate structure may be formed of an electrically insulating material. At this time, the second insulating layer may not be required.

In the monolithic light emitting diode array, the at least light emitting stack may include a plurality of light emitting stacks.

Portions of the conductive layers adjacent to the first surfaces may be substantially flush with the first surfaces of the light emitting stacks, respectively. Portions of the conductive layers adjacent to the first surfaces may be lower than the first surfaces of the light emitting stacks, respectively.

The light emitting device may include at least one circuit layer formed to electrically connect the light emitting stacks to one another. The at least one circuit layer may include a circuit layer connecting an exposed portion of the conductive layer of one of the light emitting stacks to the first contact of another light emitting stack. The at least one circuit layer may include a circuit layer connecting an exposed portion of the conductive layer of one of the light emitting stacks to an exposed portion of the conductive layer of another light emitting stacks. The light emitting device may further include a third insulating layer formed on a portion of the first surface of the light emitting stack where the circuit layer is to be formed. The plurality of light emitting stacks may be electrically connected to one another to be operable in response to an alternating current voltage.

According to another aspect of the present invention, there is provided a method of manufacturing a light emitting device, the method including: forming at least one light emitting stack on a growth substrate to include first and second conductivity type semiconductor layers and an active layer therebetween, wherein the light emitting stack has first and second surfaces defined by the first and second conductivity type semiconductor layers, respectively to oppose each other and side surfaces interposed therebetween; forming a second contact on at least a portion of the second surface of the light emitting stack and then a first insulating layer on the second surface excluding the portion where the second contact is formed and the side surfaces of the light emitting stack; forming a conductive layer connected to the second contact and extended along one of the side surfaces of the light emitting stack to a portion adjacent to the first surface; forming a substrate structure to surround the side surfaces and the second surface of the light emitting stack; separating the light emitting stack from the growth substrate to expose the portion of the conductive layer extended to the first surface; and forming a first contact on the first surface of the light emitting stack to contact the first conductivity type semiconductor layer.

The substrate structure may be formed of a conductive material. Here, the method may further include forming a second insulating layer on the side surfaces and the second surface of the light emitting stack, between the forming a conductive layer and the forming a substrate structure.

The forming a substrate structure may be performed by plating.

The substrate structure may be formed of an electrically insulating material.

The forming a second contact and then a first insulating layer may include: forming a first insulating layer on the second surface excluding a portion where the second contact is to be formed and the side surface of the light emitting stack; and forming the second contact on the second surface where the first insulating layer is not formed.

The at least one light emitting stack may include a plurality of light emitting stacks, and the forming at least one light emitting stack includes: forming the first conductivity type semiconductor layer, the active layer and the second conductivity type semiconductor layer sequentially on the growth substrate; and mesa-etching the formed layers to obtain the plurality of light emitting stacks.

The first insulating layers may be extended to portions between the plurality of light emitting stacks, respectively, and wherein the method may include removing the portions of the first insulating layers formed between the plurality of light emitting stacks.

The mesa-etching may be performed to expose the growth substrate in the portions between the plurality of light emitting stacks. The forming a conductive layer may include forming the conductive layer connected to the second contact and extended along one of the side surfaces of each of the light emitting stacks to the exposed portions of the growth substrate.

The mesa-etching may be performed such that the first conductive layer at least partially remains in the portions between the plurality of light emitting stacks. The forming a conductive layer may include forming the conductive layer connected to the second contact and extended along one of the side surfaces of each of the light emitting stacks to the remaining first conductivity type nitride semiconductor layer.

According to still another aspect of the present invention, there is provided a monolithic light emitting diode array including: first to fifth light emitting diode cells each comprising a light emitting stack having first and second conductivity type semiconductor layers and an active layer disposed therebetween, a first contact formed to contact the first conductivity type semiconductor layer and a second contact layer formed to contact the second conductivity type semiconductor layer; a substrate structure having the first to fifth light emitting diode cells embedded therein to expose a surface of the second conductivity type semiconductor layer where the second contact is formed; an insulating layer formed on a surface of the light emitting stack of each of the light emitting diode cells, embedded in the substrate structure excluding a portion where the second contact layer is formed; a conductive layer formed to have a portion in contact with the second contact of the each light emitting diode cell, the conductive layer extended along the insulating layer to have an extension portion adjacent to the top surface of the substrate structure; and a circuit layer formed on the top surface of the substrate structure to connect one of the first contact and the extension portion of the conductive layer of one of the light emitting cells to one of the first contact and the extension portion of the conductive layer of another light emitting diode cell.

The circuit layer may be formed such that the first contact of the first light emitting diode cell and the second contact of the second light emitting diode cell are connected to one power terminal, the second contact of the third light emitting diode cell and the first contact of the second light emitting diode cell are connected to another power terminal, the first contact of the fifth light emitting diode cell and the second contacts of the first and fourth light emitting diode cells have a common point of contact, and the second contact of the fifth light emitting diode cell and the first contact of the second and third light emitting diode cells have a common point of contact.

In the specification, "a light emitting stack" refers to a structure having epitaxial layers stacked to constitute a light emitting diode. A "light emitting diode (LED) cell" refers to a light emitting stack having a contact structure. Moreover, a "monolithic light emitting diode array" refers to a light emitting device having a plurality of light emitting stacks or light emitting diode (LED) cells. Therefore, the monolithic light emitting diode array is used similarly to a "light emitting device having a plurality of light emitting stacks."

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
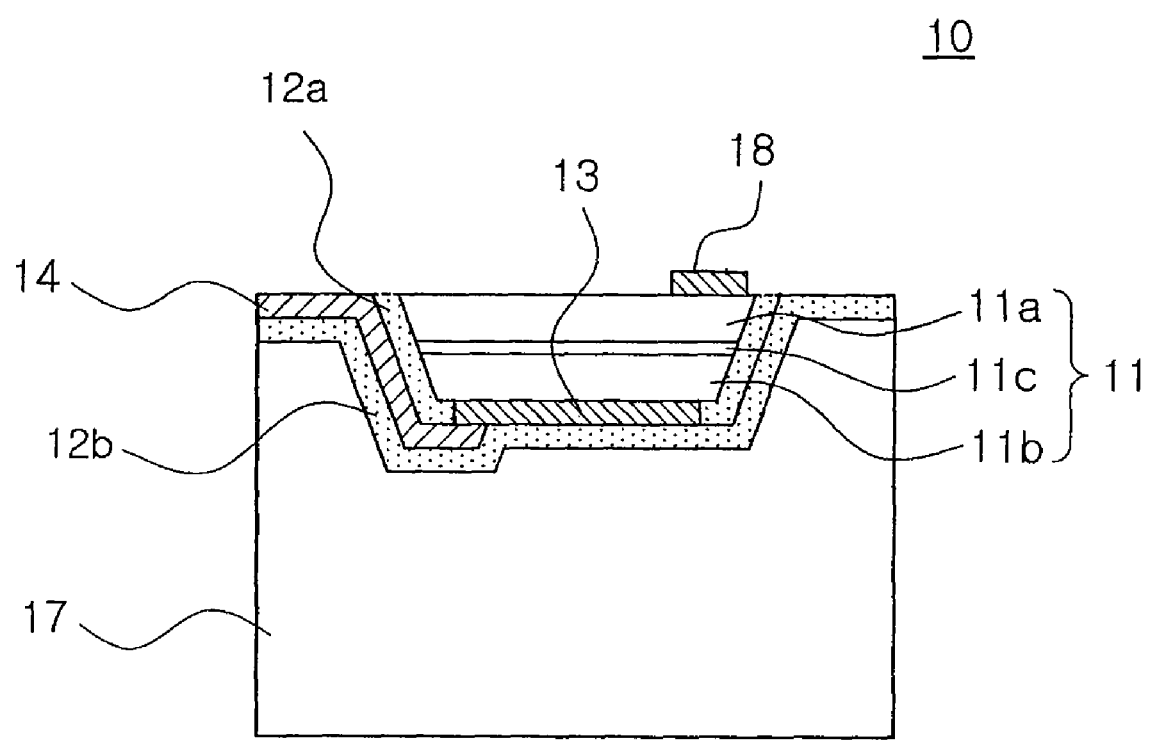
FIG. 1 is a side cross-sectional view illustrating a light emitting device according to an exemplary embodiment of the invention.

FIG. 1 is a side cross-sectional view illustrating a light emitting device according to an exemplary embodiment of the invention. FIG. 1 shows a light emitting device configured as a single cell structure in which a variety of circuit connections can be easily formed.

As shown in FIG. 1, the light emitting device 10 of the present embodiment includes a light emitting stack 11 having first and second conductivity-type semiconductor layers 11a and 11b and an active layer 11c disposed therebetween, and a substrate structure 17 formed to surround a bottom surface and side surfaces of the light emitting stack 11. The light emitting stack 10 applicable to the present embodiment may be formed of not only AlGaInN but also a known semiconductor material such as AlGaAs, AlGaInP, and ZnO.

First and second contacts 18 and 13 are formed on a top surface and the bottom surface of the light emitting stack 11 to contact the first and second conductive semiconductor layers 11a and 11b, respectively. Light generated from the active layer 11c is emitted through the top of the light emitting stack 11, i.e., the first conductivity type semiconductor layer 11a. To ensure effective light emission, as in the present embodiment, the first contact 13 is formed only on a portion of the top surface of the light emitting stack 11. Alternatively, the first contact 13 may be formed of a light transmissive electrode material.

A first insulating layer 12a is formed on a portion of the bottom surface of the light emitting stack 11 where the second contact 13 is not formed and side surfaces thereof. The first insulating layer 12a may be a high resistance oxide or a nitride such as $SiO_2$, $Si_3N_4$, AlN, and $Al_2O_3$.

The light emitting device 10 include a conductive layer 14 connected to the second contact 13 and extended along one of the side surfaces of the light emitting stack 11. Here, the conductive layer 14 may be electrically insulated from the light emitting stack 11 by the first insulating layer 12a. A portion of the conductive layer 14 adjacent to the top surface of the light emitting stack 11 is exposed toward the top surface. An exposed portion of the conductive layer 14 and the first contact 18 (other conductive material areas extended from respective parts) may be provided as a bonding area connected to an external circuit.

According to the present embodiment, the substrate structure 17 may be made of a conductive material. The conductive material is generally high in thermal conductivity and thus may be utilized as a substrate of the light emitting device 10. The substrate structure 17 may be a metal layer and formed by plating to easily obtain a sufficient thickness as a supporting body. As described above, when the substrate structure 17 is electrically conductive, a second insulating layer 12b is additionally formed between the light emitting stack 11 and the substrate structure 17. The second insulating layer electrically insulates the second contact 13 and the conductive layer 14 of the light emitting stack 11 from the substrate structure 17. Of course, the substrate structure 17 may be made of an electrically insulating material. Here, the second insulating layer 12b may not be required.

As described above, the second contact 13 embedded in the substrate structure 17 is led out to the top surface of the substrate structure 17 through an electrode lead-out structure having the conductive layer 14 and the first and second insulating layers 12a and 12b. This allows the contact areas of opposite polarity to be formed on a substantially identical surface.

The plurality of light emitting stacks structured as above, when applied to a monolithic light emitting diode array, easily allows a circuit structure in which the light emitting stacks are connected in series with or parallel to one another.

Figure 2:
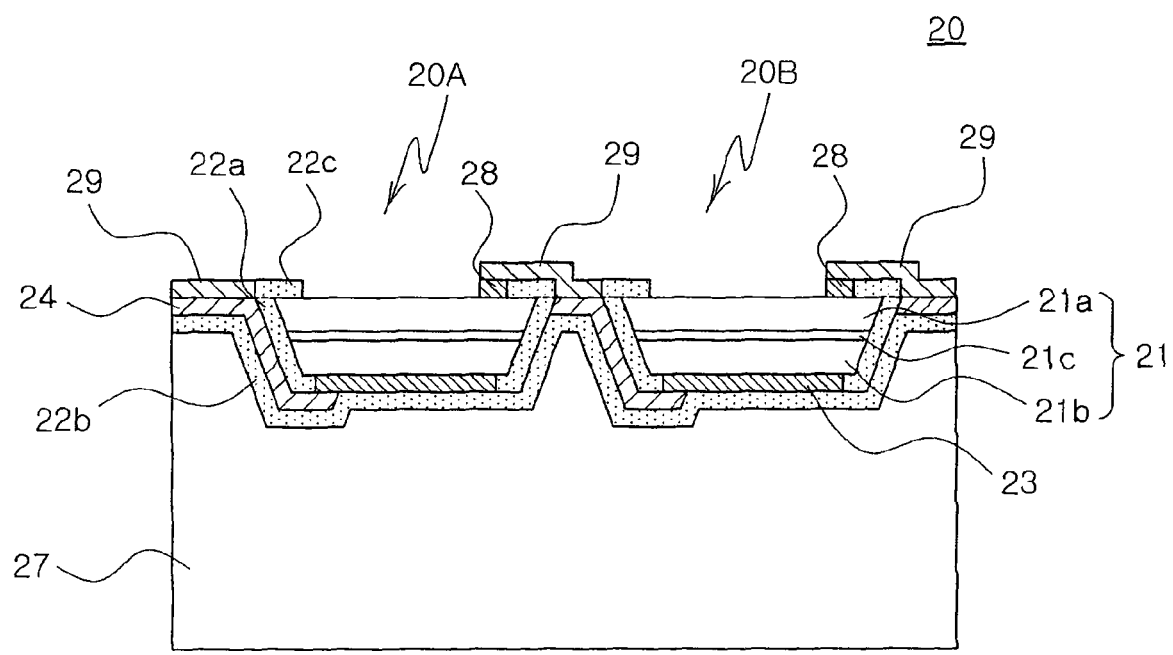
FIG. 2 is a side cross-sectional view illustrating one circuit structure of a monolithic light emitting diode array as a light emitting device according to another example of the invention.
Figure 3:
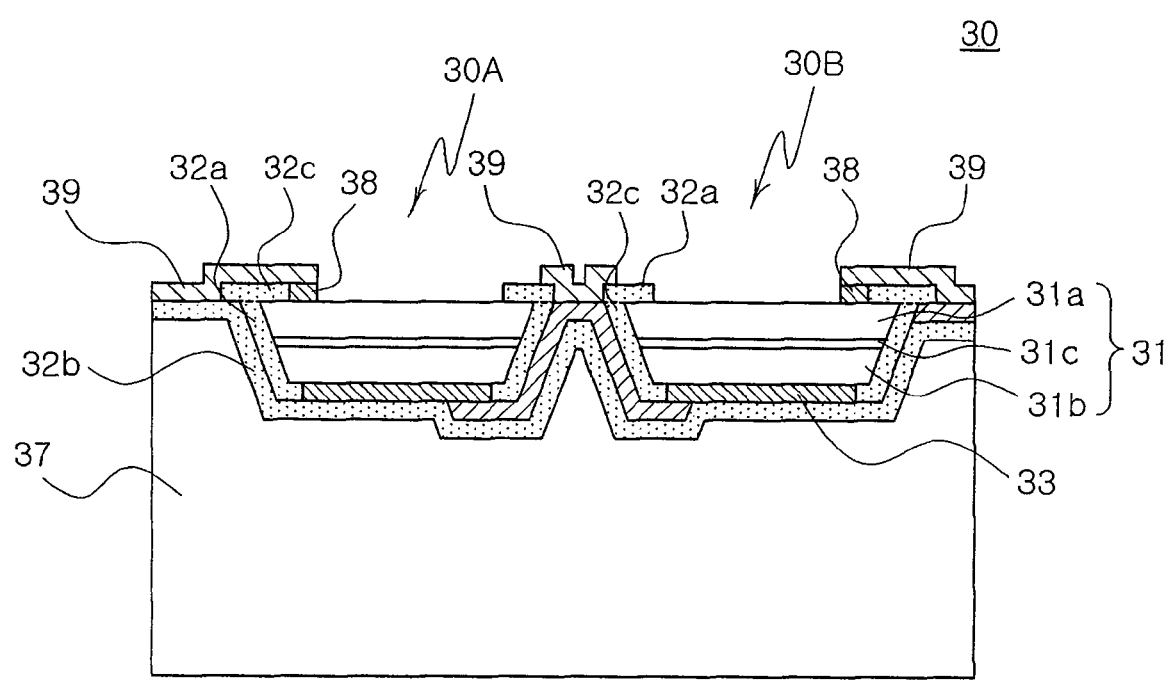
FIG. 3 is a side cross-sectional view illustrating another circuit structure of a monolithic light emitting diode array as a light emitting device according to still another example of the invention.

FIGS. 2 and 3 are side cross-sectional views illustrating examples of a circuit structure of a monolithic light emitting device according to another exemplary embodiment of the invention. The monolithic light emitting diode arrays shown in FIGS. 2 and 3 are understood to be a serial and parallel structure, respectively.

First, FIG. 2 illustrates the monolithic light emitting diode array 20 having two light emitting stacks 21 provided as respective LED cells 20A and 20B connected in series with each other.

Each of the light emitting stacks 21 includes first and second conductivity-type semiconductor layers 21a and 21b, and an active layer 21c disposed therebetween. Also, the light emitting diode array 20 includes a substrate structure 27 surrounding a bottom surface and side surfaces of the light emitting stack 21.

First and second contacts 28 and 23 are formed on a top surface and the bottom surface of the light emitting stack 21 to contact the first and second conductivity type semiconductor layers 21a and 21b, respectively. The first contact 28 is formed only on a portion of the top of the light emitting stack 21. Alternatively, to ensure light to be emitted more effectively, the first contact 28 may be formed of a transparent electrode material. Of course, as in the present embodiment, the first contact 28, even when formed only partially on the top surface of the light emitting stack 21, may be formed of a transparent electrode material. Moreover, to assure the light emitting stacks 21 to be connected through circuits easily, the first contact 28, as shown, may be formed at an edge of the top surface of the light emitting stack 21.

A first insulating layer 22a is formed on a portion of the bottom surface of the light emitting stack 21 where the second contact 23 is not formed and side surfaces thereof. The first insulating layer 22a may be made of a high-resistance oxide or a nitride such as $SiO_2$, $Si_3N_4$, AlN, and $Al_2O_3$.

Also, the light emitting device 20 includes a conductive layer 24 connected to the second contact 23 and extended along one of the side surfaces of the light emitting stack 21. Here, the conductive layer 24 may be electrically insulated from the light emitting stack 21 by the first insulating layer 22a.

Here, the conductive layer 24 may be extended to an appropriate one of the side surfaces of the light emitting stack 21 according to a desired circuit connection structure of the LED cells. That is, as in the present embodiment, to ensure the LED cells to be connected in series, the conductive layer 24 of one 20B of the LED cells may be extended along the side surface adjacent to another LED cell 20A.

The conductive layer 24 is extended to a portion adjacent to the top surface of the light emitting stack 21 so that the embedded second contact 23 can be connected to the conductive layer 24 connected to another second contact 23 or the first contact 28 by an additional circuit layer 29.

That is, as in the present embodiment, the conductive layer 24 of the LED cell 20B is extended from the first contact 28 of the LED cell 20B, and can be connected to the first contact 28 of another adjacent LED cell 20A by the circuit layer 29. FIG. 2 illustrates only the two LED cells 20A and 20B. But it is easily apparent to those skilled in the art that this connection structure can be applied in a similar fashion to three LED cells or more.

In the present embodiment, the substrate structure 27 may be made of a conductive material. The substrate structure 27 may be a metal layer formed by plating. The substrate structure 27 is electrically conductive, and thus a second insulating layer 22b may be additionally formed between the light emitting stack 21 and the substrate structure 27. The second insulating layer 22b electrically insulates the second contact 23 and the conductive layer 24 of the light emitting stack 21 from the substrate structure 27.

To effectively prevent the circuit layer 29 from contacting an undesired area of the light emitting stack 21, a third insulating layer 22c may be additionally formed on the top surface of the light emitting stack 21 where the circuit layer 29 is to be formed.

As described above, the second contact 23 embedded in the substrate structure 27 may be led out to the top surface of the substrate structure 27 through an electrode lead-out structure having the conductive layer 24 and the first and second insulating layers 22a and 22b. This allows the first and second contacts 28 and 23 to be formed on a substantially identical surface. Therefore, the LED cells can be easily connected in series together by the circuit layer 29 formed in a simple process.

The monolithic light emitting diode array 30 shown in FIG. 3 has a circuit structure of LED cells 30A and 30B connected in parallel with each other.

As shown in FIG. 3, the monolithic light emitting diode array includes two light emitting stacks 21 provided as respective LED cells 30A and 30B. Each of the light emitting stacks 31 includes first and second conductivity-type semiconductor layers 31a and 31b, and an active layer 31c disposed therebetween. The light emitting diode array 30 also includes a substrate structure 37 surrounding a bottom surface and side surfaces of the light emitting stack 31.

In a similar manner to the previous embodiment, fist and second contacts 38 and 33 are formed on a top surface and the bottom surface of the light emitting stack 31 to contact the first and second conductivity type semiconductor layers 31a and 31b, respectively. The first contact 38 is formed only on a portion of the top surface of the light emitting stack 31.

A first insulating layer 32a is formed on a portion of the bottom surface of the light emitting stack 31 where the second contact 33 is not formed and side surfaces thereof. The first insulating layer 32a may be made of a high-resistance oxide or a nitride such as $SiO_2$, $Si_3N_4$, AlN, and $Al_2O_3$. Also, the light emitting device 30 includes a conductive layer 34 connected to the second contact 33 and extended along one of the side surfaces of the light emitting stack 31. Here, the conductive layer 34 may be electrically insulated from the light emitting stack 31 by the first insulating layer 32a.

In the present embodiment, the substrate structure 37 may be made of a conductive material. The substrate structure 37 may be a metal layer formed by plating. The substrate structure 37 is electrically conductive, and thus a second insulating layer 32b may be additionally formed between the light emitting stack 31 and the substrate structure 37. As described in the previous embodiment, the second insulating layer 32b electrically insulates the second contact 33 and the conductive layer 34 of the light emitting stack 31 from the substrate structure 37.

Also, in the present embodiment, to allow the LED cells to be connected in parallel to each other, the conductive layer 34 of one of the two adjacent LED cells 30A and 30B may be extended along the side surface adjacent to another LED cell 30A or 30B. In this structure, the respective conductive layers 34 of the LED cells 30A and 30B may be connected to each other. The conductive layers 34 of the LED cells 30A and 30B, even though not connected directly to each other, may have respective portions adjacent to the top surfaces of the corresponding LED cells connected together by a circuit layer 39. This allows the embedded second contacts 33 of the LED cells 30A and 30B to be electrically connected together.

To effectively prevent the circuit layer 38 from contacting an undesired area of the light emitting stack 31, a third insulating layer 32c may be additionally formed on the top surface of the light emitting stack 31 where the circuit layer 39 is to be formed.

FIG. 3 illustrates only the two LED cells 30A and 30B. But it is easily apparent to those skilled in the art that this connection structure can be applied in a similar fashion to three LED cells or more.

As described above, similarly to the previous embodiment, the second contact 33 embedded in the substrate structure 37 is led out to the top surface of the substrate structure 37 through an electrode lead-out structure having the conductive layer 34 and the first and second insulating layers 32a and 32b. This allows the contact areas of opposite polarity to be formed on a substantially identical surface. Therefore, as in the present embodiment, the LED cells can be easily connected in parallel together by the circuit layer 39 formed in a simple process.

The aforesaid light emitting device, or the monolithic light emitting diode array including the plurality of LED cells and the circuit structure may be manufactured by a general method of manufacturing a vertical light emitting diode which adopts a process of separating a substrate.

FIGS. 4A to 4G are procedural cross-sectional views for explaining a method of manufacturing a monolithic light emitting diode array according to an exemplary embodiment of the invention.

Figure 4A:
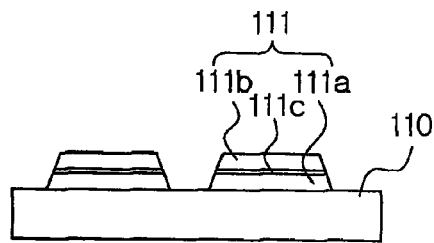
FIGS. 4A to 4G are procedural cross-sectional views for explaining a method of manufacturing a monolithic light emitting diode array according to an exemplary embodiment of the invention.

First, as shown in FIG. 4A, an n-type semiconductor layer 111a, an active layer 111c and a p-type semiconductor layer 111b are sequentially grown on a growth substrate 110 and then the layers formed are mesa-etched to produce a plurality of light emitting stacks 111.

The n-type and p-type semiconductor layers 111a and 111b and the active layer 111c may be made of not only AlGaInN but also a known semiconductor material such as AlGaAs, AlGaInP, and ZnO. In the present embodiment, the mesa-etching is performed to a depth enabling the growth substrate 110 to be exposed, thereby completely separating the epitaxial layers 111a, 111b, and 111c into two light emitting stacks 111. As described above, each of the two light emitting stacks 111 is defined by the n-type and p-type semiconductor layers 111a and 111b. The light emitting stack 111 has first and second surfaces opposing each other and side surfaces disposed therebetween.

Figure 4B:
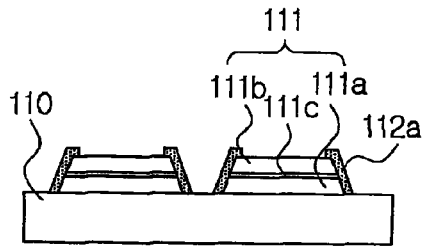

Then, as shown in FIG. 4B, a first insulating layer 112a is formed on the second surface of the light emitting stack 111 excluding a portion where a contact is to be formed and the side surfaces thereof.

To form the insulating layer 112a, an insulator is deposited on an entire area of the second surface and the side surfaces of the light emitting stack 111 and then a desired area for forming the contact is selectively removed. The first insulating layer 112a may be made of a high-resistance oxide or a nitride such as $SiO_2$, $Si_3N_4$, AlN, and $Al_2O_3$.

In the present embodiment, the first insulating layer 112a is extended to a portion between the light emitting stacks 111. In this case, after separating the light emitting stack 111, the portion of the first insulating layer 112a formed between the light emitting stacks 111 may be removed. Alternatively, in this process, the portion of the first insulating layer 112a between the light emitting stacks 111 may be additionally removed to expose the conductive layer, which is necessary along with a process of separating the growth substrate 110.

Figure 4C:
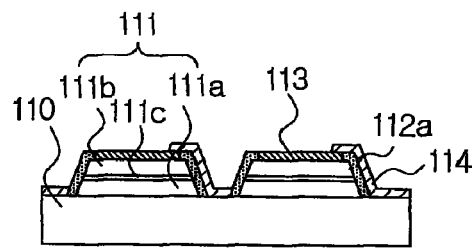

Subsequently, as shown in FIG. 4C, a p-type contact layer 113 is formed on an exposed contact-forming portion of the second surface of the light emitting stack 111. A conductive layer 114 is formed to connect to the p-type contact layer 113 and extended along one of the side surfaces of the light emitting stack 111 to a portion adjacent to the first surface.

The p-type contact layer 113 may be made of an electrode material which forms an ohmic contact with the p-type semiconductor layer 111b. The conductive layer 114 is extended from a portion of the p-type contact layer 113 along the side surface of the light emitting stack 111 where the first insulating layer 112a is formed, and then to the portion adjacent to the first surface. As described above, the side surface having the conductive layer 114 formed thereon may be adjacent to another light emitting stack to be connected with each other. Even though the p-contact layer 113 is embedded in the substrate structure 110 in a later process, the conductive layer 114 connected to the p-type contact layer 113 may have a portion exposed toward the first surface of the light emitting stack 111. This allows the light emitting stack 111 to be connected suitably via circuits to another light emitting stack.

Figure 4D:
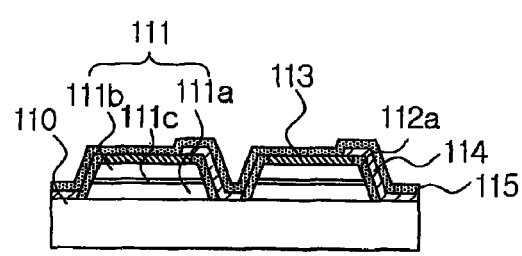

Thereafter, as shown in FIG. 4D, a second insulating layer 112b may be formed on the side surfaces and the second surface of the light emitting stack 111.

The second insulating layer 112b electrically insulates a substrate structure (117 of FIG. 4E) to be formed in a later process from the conductive layer 114. Therefore, the second insulating layer 112b is formed to enclose at least the conductive layer 114. Similarly to the first insulating layer 112a, the second insulating layer 112b may be made of a high resistance oxide or a nitride such as $SiO_2$, $Si_3N_4$, AlN, and $Al_2O_3$. The second insulating layer 112b is required when the substrate structure 117 is formed of a conductive material. Therefore, in a case where the substrate structure 117 is formed of an electrically insulating material, the second insulating layer 112b may not be formed.

Figure 4E:
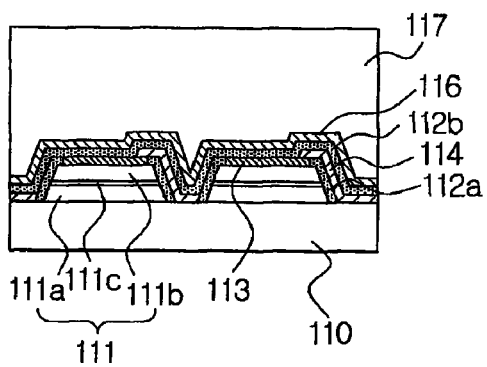

Next, as shown in FIG. 4E, the substrate structure 117 is formed to surround the side surfaces and the second surface of the light emitting stack 111.

In the present embodiment, the substrate structure 117 is obtainable by forming a seed layer 116 on the second insulating layer 112b to facilitate plating and then performing plating. The substrate structure 117 is made of a metal material formed by plating, but not limited thereto. As described above, the substrate structure 117 may utilize an insulating substrate in place of a conductive substrate made of e.g., metal.

Figure 4F:
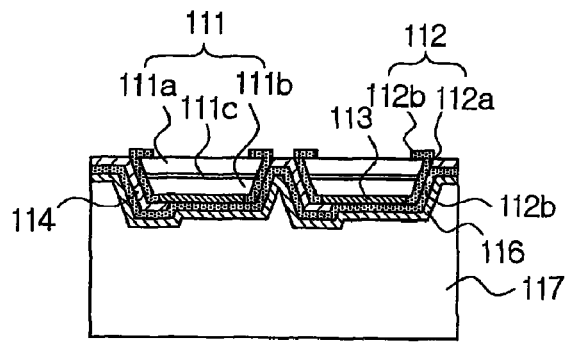

Afterwards, as shown in FIG. 4F, the light emitting stack 111 is removed from the growth substrate 110. Optionally, as in the present embodiment, a third insulating layer 112c may be formed on a portion of the first surface of the light emitting stack 111.

After forming the substrate structure 117, the growth substrate 110 is removed from the light emitting stack 111. The growth substrate 110 may be removed by a known process such as mechanical polishing or chemical mechanical polishing, chemical etching, particularly by laser lift-off. Through this process, the previously formed conductive layer 114 can be partially exposed at the first surface of the light emitting stack 111. An exposed portion of the conductive layer 114 may serve as an external connection structure for the p-side contact layer 113 embedded.

Figure 4G:
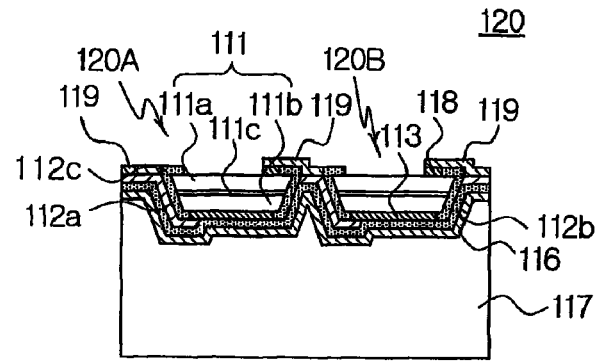

Finally, as shown in FIG. 4G, an n-side contact layer 118 is formed on the first surface of the light emitting stack 111 to connect to the n-type semiconductor layer 111a. Then, a circuit layer 119 is formed to connect the LED cells 120A and 120B to each other.

This process is associated with an exposed surface defined by removing the growth substrate 110. The exposed surface includes the first surface of the light emitting stack 111. The desired n-side contact layer 118 is formed on a portion of the first surface of the light emitting stack 111. The n-side contact layer 118 may be made of an electrode material which forms an ohmic contact with the n-type semiconductor layer 111b. Then, the circuit layer 119 is formed to connect the LED cells 120A and 120B including the respective light emitting stacks 111 to each other.

As in the present embodiment, optionally, the process of forming the third insulating layer 112c on the first surface of the light emitting stack 111 may be additionally performed prior to the process of forming the circuit layer 119. This process is aimed at preventing an undesired connection. In the monolithic light diode array 120 of the present embodiment, similarly to FIG. 2, the circuit layer 119 connects the n-side contact layer 118 of the LED cell 120A to the p-side contact layer 113 of the LED cell 120B, i.e., the exposed portion of the conductive layer 114 connected to the p-side contact layer 113. However, as shown in FIG. 3, the monolithic light emitting diode array 120 may easily adopt other connection structures.

In the aforesaid manufacturing process, the epitaxial layers are completely separated by deep-mesa etching to expose a growth substrate for forming the light emitting stacks. However, alternatively, the mesa-etching may be performed to produce the light emitting stacks, while partially leaving the expitaxial layers. Here, the conductive layer is prevented from being impaired by a process such as laser lift off.

FIGS. 5A to 5G are procedural cross-sectional views illustrating a method of manufacturing a monolithic light emitting diode array using shallow mesa etching according to an another exemplary embodiment of the invention.

Figure 5A:
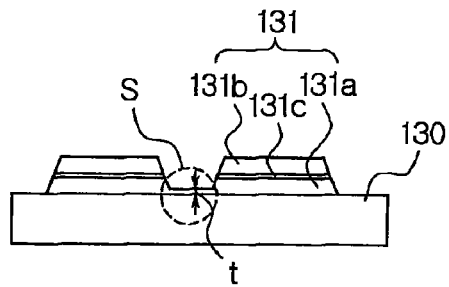
FIGS. 5A to 5G are a procedural view for explaining a method of manufacturing a monolithic light emitting diode array according to another exemplary embodiment of the invention.

First, as shown in FIG. 5A, an n-type semiconductor layer 121a, an active layer 131c and a p-type semiconductor layer 131b are sequentially grown on a growth substrate 130 and then the layers formed are mesa-etched to produce a plurality of light emitting stacks 131.

In the process of separating the epitaxial layers into the plurality of light emitting stacks 131 according to the present embodiment, the epitaxial layers 131a, 131b, and 131c are mesa-etched to partially remain with a predetermined thickness t, particularly 131a. As described above, the remaining portion has a thickness such that the conductive layer is prevented from being impaired during a process of removing the growth substrate and the remaining portion is easily removed in a later process.

In a similar manner to the light emitting stacks 111 shown in FIG. 4A, each of the two light emitting stacks 131 obtained through the above process is defined by the n-type and p-type semiconductor layers 131a and 111b. The light emitting stack 131 is structured to have first and second surfaces opposing each other and side surfaces disposed therebetween.

Figure 5B:
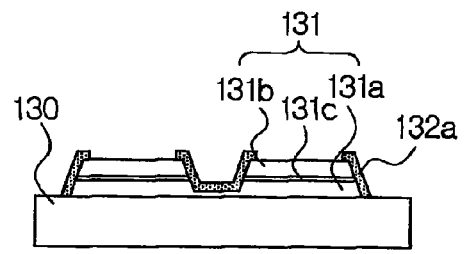

Then, as shown in FIG. 5B, a first contact layer 132a is formed on the second surface of the light emitting stack 131 excluding a portion where a contact is to be formed and the side surfaces thereof.

To form the insulating layer 132a, an insulator is deposited on an entire area of the second surface and the side surfaces of the light emitting stack 131 and then a desired area for forming a contact is selectively removed. The first insulating layer 132a may be made of a high-resistance oxide or a nitride such as $SiO_2$, $Si_3N_4$, AlN, and $Al_2O_3$.

Figure 5C:
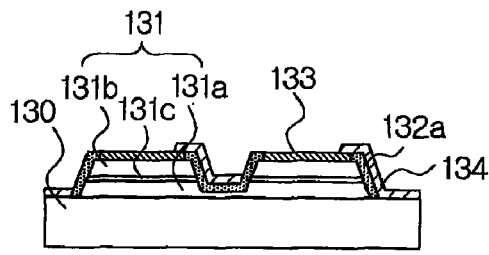

Subsequently, as shown in FIG. 5C, a p-type contact layer 133 is formed on an exposed contact-forming portion of the second surface of the light emitting stack 131. A conductive layer 134 is formed to connect to the p-type contact layer 133 and extended along one of the side surfaces of the light emitting stack 131 to a portion adjacent to the first surface.

The p-type contact layer 133 may be made of an electrode material which forms an ohmic contact with the p-type semiconductor layer 131*b*. The conductive layer 134 is extended from a portion of the p-side contact layer 133 along the side surface of the light emitting stack 131 where the first insulating layer 132*a* is formed, and then to the portion adjacent to the first surface.

Even though the p-side contact layer 133 is embedded in the substrate structure 130 in a later process, the conductive layer 134 connected to the p-side contact layer 133 may have a portion exposed toward the first surface of the light emitting stack 131. This allows the light emitting stack 131 to be connected suitably via circuits to another light emitting stack.

Figure 5D:
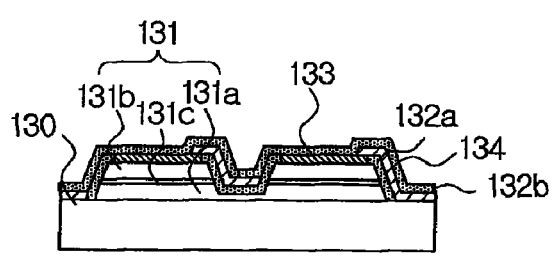

Thereafter, as shown in FIG. 5D, a second insulating layer 132*b* may be formed on the side surfaces and the second surface of the light emitting stack 131.

The second insulating layer 132*b* electrically insulates a substrate structure (137 of FIG. 5E) to be formed in a later process from the conductive layer 134. Therefore, the second insulating layer 132*b* is formed to enclose at least the conductive layer 134.

Figure 5E:
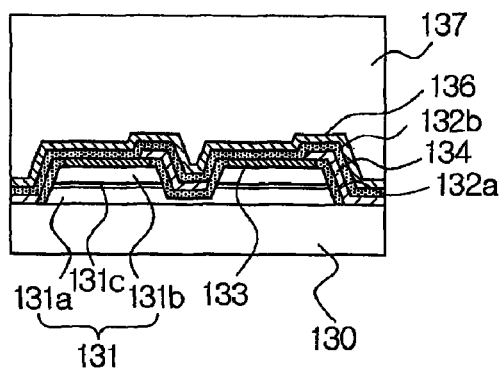

Next, as shown in FIG. 5E, the substrate structure 137 is formed to surround the sides and the second surface of the light emitting stack 131.

In the present embodiment, the substrate structure 137 is obtainable by forming a seed layer 136 on the second insulating layer 132*b* to facilitate plating and then performing plating. The substrate structure 137 is made of a metal material formed by plating, but not limited thereto. The substrate structure 137 may utilize an insulating substrate in place of a conductive substrate made of e.g., metal.

Figure 5F:
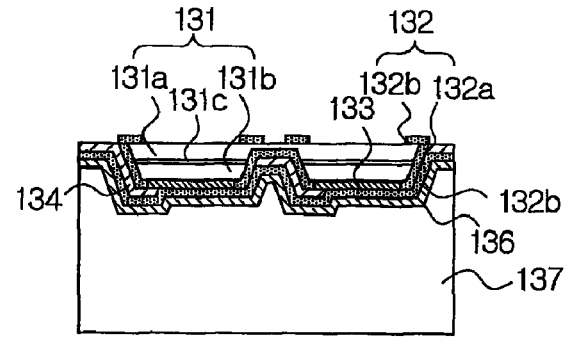

Afterwards, as shown in FIG. 5F, the light emitting stack 131 is removed from the growth substrate 130. Optionally, as in the present embodiment, a third insulating layer 132*c* may be formed on a portion of the first surface of the light emitting stack 131.

After forming the substrate structure 137, the growth substrate 130 is removed from the light emitting stack 131. The growth substrate 130 may be removed by a known process such as mechanical polishing or chemical mechanical polishing, particularly by laser lift off.

The conductive layer 134 is protected by a remaining epitaxial layer portion S and thus prevented from being damaged by chemical mechanical polishing or laser lift-off in the removal process of the growth substrate. Also, the remaining epitaxal layer portion S needs to be removed together with a portion of the first insulating layer to partially expose the conductive layer 134. The remaining epitaxial layer portion may be removed by laser radiation. However, optionally, additional etching may be performed to partially expose the conductive layer 134, which is a necessary process for circuit connections.

The previously formed conductive layer 134 can be partially exposed at the first surface of the light emitting stack 131. An exposed portion of the conductive layer 134 may serve as an external connection structure for the p-side contact layer 133 embedded.

Figure 5G:
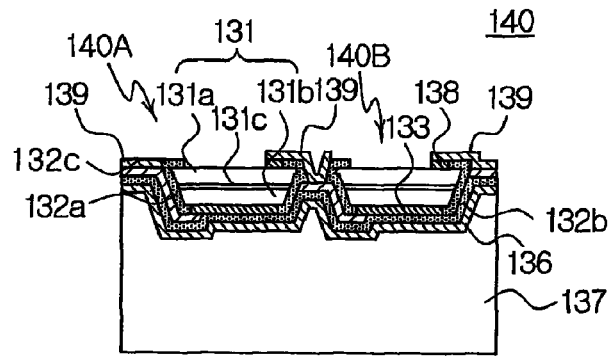

Finally, as shown in FIG. 5G, an n-side contact layer 138 is formed on the first surface of the light emitting stack 131 to connect to the n-type semiconductor layer 131*a*. Then, a circuit layer 139 is formed to connect the LED cells 140A, and 140B to each other.

In this process, the growth substrate 130 is removed to define an exposed surface. The exposed surface includes the first surface of the light emitting stack 131. The desired n-side contact layer 138 is formed on a portion of the first surface of the light emitting stack 131. The n-side contact layer 138 may be made of an electrode material which forms an ohmic contact with the n-type semiconductor layer 131*b*.

Then, the circuit layer 139 is formed to connect the LED cells 140A and 140B including the respective light emitting stacks 131 to each other.

As in the present embodiment, optionally, the process of forming the third insulating layer 132*c* on the first surface of the light emitting stack 131 may be additionally formed prior to the process of forming the circuit layer 139. This process is aimed at preventing the circuit layer 139 form contacting an undesired area. In the monolithic light emitting diode array 140 of the present embodiment, similarly to FIG. 2, the circuit layer 139 connects the n-side contact layer 133 of the LED cell 140A to the p-side contact layer 133 of the LED cell 140B i.e., the exposed portion of the conductive layer 139 connected to the p-side contact layer 133. However, as shown in FIG. 3, the monolithic light emitting diode array 130 may easily adopt other connection structures.

The monolithic light emitting diode array of the present embodiment has an external connection structure of the both contacts formed on the substantially identical surface. This allows easy complicated connection of the plurality of LED cells to one another via circuits. Especially, the monolithic light emitting device connected to be operable in response to an alternating current voltage tends to require complicated circuit structures. Therefore, the monolithic light emitting device of the present invention is beneficially applicable.

Figure 6A:
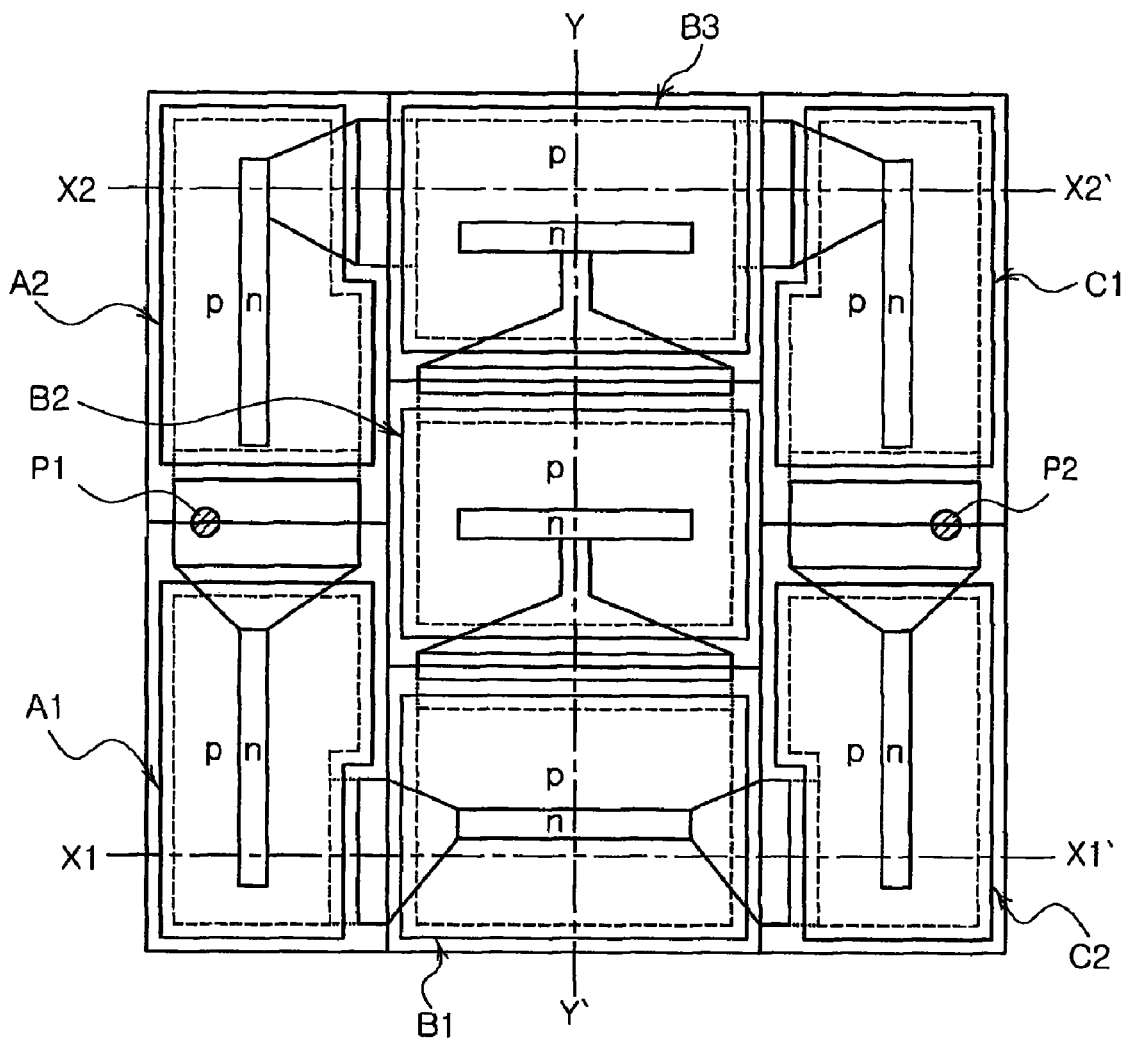
FIG. 6A is a view illustrating an arrangement of a monolithic light emitting diode array according to an exemplary embodiment of the invention and FIG. 6B is an equivalent circuit diagram of FIG. 6A.
Figure 6B:
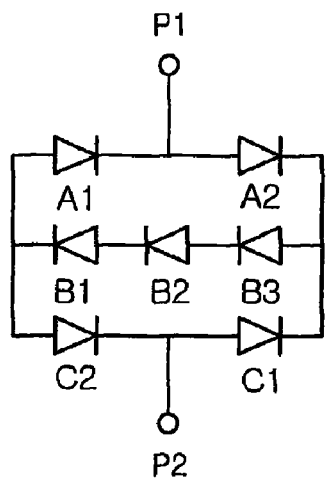

FIG. 6A is a layout diagram illustrating a monolithic light emitting diode array according to an exemplary embodiment of the invention. FIG. 6B illustrates an equivalent circuit of the monolithic light emitting diode array.

The monolithic light emitting diode array shown in the layout diagram of FIG. 6A includes first and second LED cells A1 and A2 formed at one edge and third and fourth LED cells C1 and C2 formed at an opposing edge, and three five LED cells B1, B2, and B3 disposed between the first and second LED cells A1 and A2 and the third and fourth LED cells C1 and C2.

Hereinafter, referring to FIG. 6B, a circuit structure of the monolithic light emitting diode array will be described.

First, an n-side contact of the first LED cell A1 and a p-side contact of the second LED cell A2 are connected to a first alternating current (AC) power terminal P1. A p-side contact of the third LED cell C1 and the n-side contact of the second LED cell C2 are connected to a second AC power terminal P2.

The three fifth LED cells B1, B2, and B3 are connected to one another in series. An n-contact of the fifth LED cell B1 disposed at one peripheral side of the array, i.e., between the first and fourth LED cells A1 and C2 forms a common point of contact with respective p-side contacts of the first and fourth LED cells A1, and C2. A p-side contact of the fifth LED cell B3 disposed at another peripheral side of the array between the second and third LED cells A2 and C1 forms a common point of contact with respective n-side contacts of the second and third LED cells A2, and C1.

In the light emitting diode array according to the above layout, the three fifth LED cells B1, B2, and B3 are always driven until the AC voltage is applied to the power terminals P1, and P2. Also, the first and fourth LED cells A1 and C2 and the second and third LED cells A2 and C1 may be driven alternatively according to a cycle of the AC voltage. As a result, even with the AC voltage applied, the five LED cells B1, B2, and B3 can be driven successively.

Moreover, the layout of the monolithic light emitting diode array is advantageous in terms of a breakdown voltage. The voltages applied to the LED cells may be substantially similar to one another in view of resistance of the breakdown voltage.

This design is effectively achieved by disposing the LED cells to occupy a substantially identical area. In addition, to this end, the number of fifth LED cells can be properly adjusted. The number of the fifth LED cells may range from 1 to 4.

As shown in FIG. 6A, the AC monolithic light emitting diode array has complicated circuit structure, posing a difficulty to configuration. However, such a circuit structure can be easily realized according to the present embodiment.

Figure 7A:
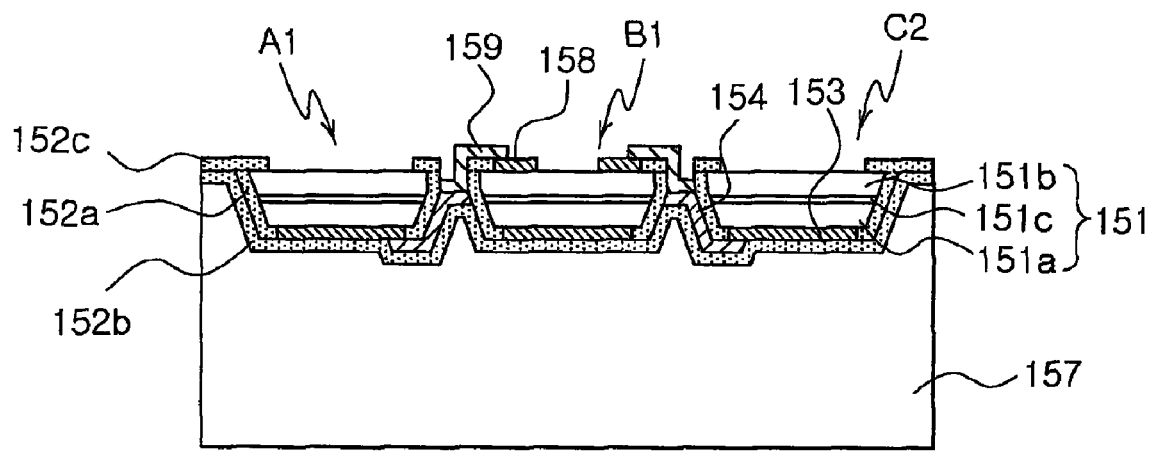
FIGS. 7A to 7C are side cross-sectional views illustrating a circuit structure applicable to the monolithic light emitting diode array shown in FIG. 6A.
Figure 7B:
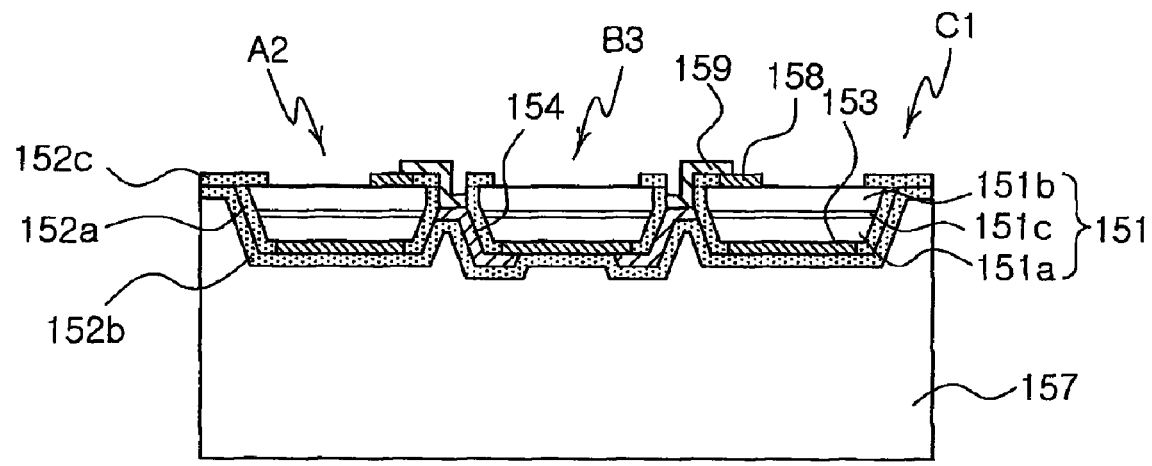
Figure 7C:
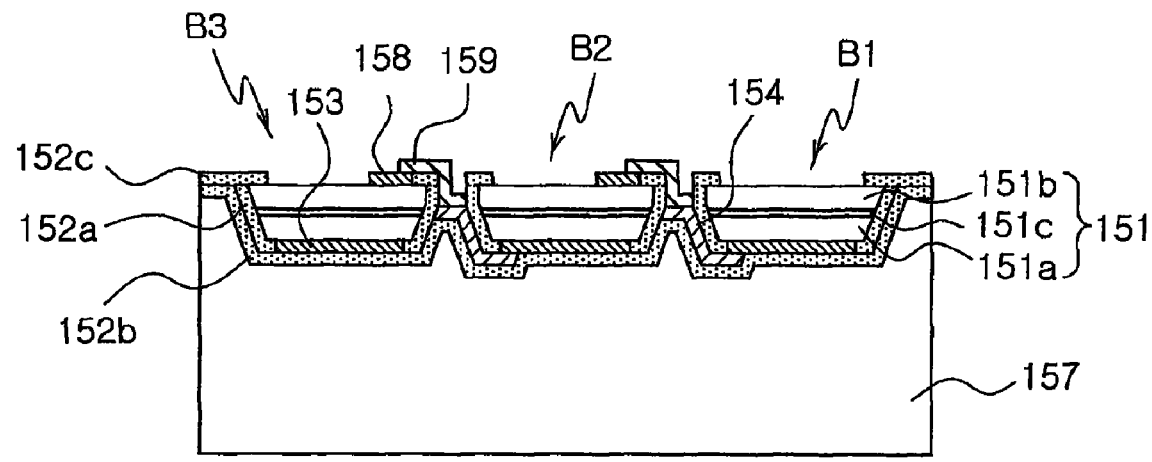

The monolithic light emitting diode shown in FIG. 6A can be configured in circuit structures shown in FIGS. 7A to 7C.

FIGS. 7A to 7C are side cross-sectional views illustrating the monolithic light emitting diode array of FIG. 6A cut along the line X1-X1', X2-X2' and Y-Y', respectively, according to an exemplary embodiment of the invention. FIGS. 7A to 7C may be explained with reference to FIGS. 2 and 3. Here, in the present embodiment, mesa-etching for forming light emitting stacks and structures thereof are illustrated in a similar manner to FIG. 3.

FIGS. 7A to 7C illustrate a substrate structure 157 having the three LED cells corresponding to respective trimming directions embedded therein. Each of the LED cells includes a light emitting stack 151 having n-type and p-type semiconductor layers 151a, and 151b and an active layer 151c disposed therebetween. The LED cells include the substrate structure 157 formed to surround a bottom surface and side surfaces of the light emitting stack 151.

Even though not partially shown depending on the trimming direction, n- and p-side contracts 158 and 153 are formed on a top surface and the bottom surface of the light emitting stack 151. A first insulating layer 152a is formed on a portion of the bottom of the light emitting stack 151 where the p-side contact 153 is not formed and the side surfaces thereof.

A conductive layer 154 is formed to connect to the p-side contact 153 and extended along one of the side surfaces of the light emitting stack 151. The conductive layer 154 may be insulated from the light emitting stack 151 by the first insulating layer 152a.

Circuit connections of the contacts shown in FIG. 6A will be described with reference to FIGS. 7A to 7C.

First, referring to FIG. 7A, the conductive layers 154 of the LED cells A1, and C2 are extended to the respective side surfaces adjacent to another LED cell or a type of contact to which the respective p-side contacts are to be connected. That is, in the structure of FIG. 7A, (X1-X1' of FIG. 6A), the conductive layers 154 of the first and fourth LED cells A1 and C2 may be extended to the respective side surfaces adjacent to the fifth LED cell B1.

To connect the light emitting stacks via circuits, the conductive layer 154 has an exposed portion adjacent to the top surface of the light emitting stack 151. The exposed portions of the first and fourth LED cells A1, and C2 are electrically connected to an n-side contact 158 of the fifth LED cell B1 by the circuit layer 159. This allows the p-side contacts 153 of the first and fourth LED cells A1, and C2 to have a common point of contact with the n-side contact 158 of the fifth LED cell B1.

Referring to FIG. 7B, which is cut along the line X2-X2' of FIG. 6A, a conductive layer 154 of the fifth LED cell B3 disposed between the second and third LED cells A2, and C1 is extended along the two side surfaces adjacent to the second and third LED cells A2, and C1, respectively. To connect the light emitting stacks via circuits, the conductive layer 154 has exposed portions adjacent to the top surface of the light emitting stack 151.

The exposed portions of the conductive layer 154 of the fifth LED cell B3 are electrically connected to respective n-side contacts 158 of the second and third LED cells A2 and C1 by the circuit layer 159. This allows the n-side contacts 158 of the second and third LED cells A2, and C1 to have a common point of contact with the p-side contact 153 of the fifth LED cell B3 disposed therebetween.

Referring to FIG. 7C, which is cut along the line Y-Y', the three fifth LED cells B1, B2, and B3 are connected in series with one another. The conductive layers 154 of the fifth LED cells B1 and B2 are extended to respective side surfaces adjacent to other fifth LED cells B2 and B3. To connect the LED cells via circuits, the conductive layers 154 have respective exposed portions adjacent to the top surface of the light emitting stack 151.

The exposed portions of the conductive layers 154 of the fifth LED cells B1 and B2 are electrically connected to n-side contacts 158 of the other fifth LED cells B2 and B3 by the circuit layer 159. This allows the three fifth LED cells B1, B2, and B3 to be connected in parallel to one another.

As described above, the LED cells can be easily connected to one another according to location of the conductive layers 154 for leading out the p-side contact 153 embedded in the substrate structure 157 and the circuit layer 159. Especially, even though described separately depending on the trimming direction, each corresponding component is formed by an identical process, and the monolithic light emitting diode array having a complicated circuit structure shown in FIG. 6A can be more effectively manufactured.

Even though not described in the aforesaid embodiment, a third insulating layer 158 may be additionally formed corresponding to location of the circuit layer 159. The third insulating layer 153 prevents the light emitting stack 151 from contacting an external component such as the circuit layer, thereby protecting the light emitting stack 151.

As set forth above, according to exemplary embodiments of the invention, one contact embedded in a substrate structure is led out through a conductive layer thereby to form both contacts on a substantially identical surface. This light emitting device may be applied to a plurality of LED cells configured as a monolithic structure. This allows an LED array with complicated connections, such as serial, parallel connection or combination thereof to be easily produced using a circuit layer formed coplanarly.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device comprising:
   at least one light emitting stack including first and second conductivity type semiconductor layers and an active layer disposed therebetween, the light emitting stack having first and second surfaces defined by the first and second conductivity type semiconductor layers, respectively to oppose each other and side surfaces interposed between the first and second surfaces;
   a first contact formed on the first surface of the light emitting stack to contact the first conductivity type semiconductor layer;
   a second contact formed on the second surface of the light emitting stack to contact the second conductivity type semiconductor layer;
   a first insulating layer formed on the second surface excluding a portion where the second contact is formed and the side surfaces of the light emitting stack;

a conductive layer connected to the second contact and extended along one of the side surfaces of the light emitting stack to have an extension portion adjacent to the first surface; and a substrate structure formed to surround the side surfaces and the second surface of the light emitting stack.

2. The light emitting device of claim 1, wherein the substrate structure is formed of a conductive material, the substrate structure further comprising a second insulating layer disposed between the light emitting stack and the substrate structure to electrically insulate the second contact and the conductive layer of the light emitting stack from the substrate structure.

3. The light emitting device of claim 2, wherein the substrate structure comprises a metal layer formed by plating.

4. The light emitting device of claim 1, wherein the substrate structure is formed of an electrically insulating material.

5. The light emitting device of claim 1, wherein the at least light emitting stack comprises a plurality of light emitting stacks.

6. The light emitting device of claim 5, wherein portions of the conductive layers adjacent to the first surfaces are substantially flush with the first surfaces of the light emitting stacks, respectively.

7. The light emitting device of claim 5, wherein portions of the conductive layers adjacent to the first surfaces are lower than the first surfaces of the light emitting stacks, respectively.

8. The light emitting device of claim 5, comprising at least one circuit layer formed to electrically connect the light emitting stacks to one another.

9. The light emitting device of claim 8, wherein the at least one circuit layer comprises a circuit layer connecting an exposed portion of the conductive layer of one of the light emitting stacks to the first contact of another light emitting stack.

10. The light emitting device of claim 8, wherein the at least one circuit layer comprises a circuit layer connecting an exposed portion of the conductive layer of one of the light emitting stacks to an exposed portion of the conductive layer of another light emitting stacks.

11. The light emitting device of claim 8, further comprising a third insulating layer formed on a portion of the first surface of the light emitting stack where the circuit layer is to be formed.

12. The light emitting device of claim 8, wherein the plurality of light emitting stacks are electrically connected to one another to be operable in response to an alternating current voltage.

13. A monolithic light emitting diode array comprising:

first to fifth light emitting diode cells each comprising a light emitting stack having first and second conductivity type semiconductor layers and an active layer disposed therebetween, a first contact formed to contact the first conductivity type semiconductor layer and a second contact layer formed to contact the second conductivity type semiconductor layer;

a substrate structure having the first to fifth light emitting diode cells embedded therein to expose a surface of the second conductivity type semiconductor layer where the second contact is formed;

an insulating layer formed on a surface of the light emitting stack of each of the light emitting diode cells, embedded in the substrate structure excluding a portion where the second contact layer is formed;

a conductive layer formed to have a portion in contact with the second contact of the each light emitting diode cell, the conductive layer extended along the insulating layer to have an extension portion adjacent to the top surface of the substrate structure; and a circuit layer formed on the top surface of the substrate structure to connect one of the first contact and the extension portion of the conductive layer of one of the light emitting cells to one of the first contact and the extension portion of the conductive layer of another light emitting diode cell.

14. The monolithic light emitting diode array of claim 13, wherein the circuit layer is formed such that the first to fifth light emitting cells are electrically connected to one another to be operable in response to an alternating current voltage.

15. The monolithic light emitting diode array of claim 14, wherein the circuit layer is formed such that the first contact of the first light emitting diode cell and the second contact of the second light emitting diode cell are connected to one power terminal, the second contact of the third light emitting diode cell and the first contact of the second light emitting diode cell are connected to another power terminal, the first contact of the fifth light emitting diode cell and the second contacts of the first and fourth light emitting diode cells have a common point of contact, and the second contact of the fifth light emitting diode cell and the first contact of the second and third light emitting diode cells have a common point of contact.

16. The monolithic light emitting diode array of claim 15, wherein the fifth light emitting diode cell comprises a plurality of light emitting diode cells connected in a serial configuration, wherein a first contact of a light emitting diode cell located at one end in the serial configuration has a common point of contact with the second contacts of the first and fourth light emitting diode cells and a second contact of a light emitting diode cell located at another end in the serial configuration has a common point of contact with the first contacts of the second and third light emitting diode cells.

17. The monolithic light emitting diode array of claim 16, wherein the fifth light emitting diode cell comprises two to four light emitting diode cells.

* * * * *